US007027086B1

(12) United States Patent
Ozawa et al.

(10) Patent No.: US 7,027,086 B1
(45) Date of Patent: Apr. 11, 2006

(54) PHOTOGRAPHING APPARATUS AND SIGNAL PROCESSING METHOD THAT ALLOW DATA OF STILL PICTURES TO BE CONVERTED INTO A MOVING PICTURE FILE

(75) Inventors: Mio Ozawa, Chiba (JP); Shiro Miyagi, Tokyo (JP); Jun Nagai, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/719,357

(22) PCT Filed: Apr. 14, 2000

(86) PCT No.: PCT/JP00/02448

§ 371 (c)(1),
(2), (4) Date: Dec. 11, 2000

(87) PCT Pub. No.: WO00/64154

PCT Pub. Date: Oct. 26, 2000

(30) Foreign Application Priority Data

Apr. 15, 1999 (JP) .................................. 11-108431

(51) Int. Cl.
H04N 5/225 (2006.01)
(52) U.S. Cl. .............................. 348/220.1; 348/333.01; 348/231.99
(58) Field of Classification Search ........... 348/203.99, 348/207.1, 207.11, 220.1, 222.1, 239, 333.01, 348/333.02, 333.05, 333.11, 333.12, 231.99, 348/333.04, 333.03
See application file for complete search history.

(56) References Cited

U.S. PATENT DOCUMENTS

| 4,750,041 A | * | 6/1988 | Vogel et al. ............. 348/220.1 |
| 5,077,612 A | * | 12/1991 | Megrgardt et al. ....... 348/231.6 |
| 6,342,900 B1 | * | 1/2002 | Ejima et al. ................ 345/698 |

FOREIGN PATENT DOCUMENTS

| JP | 9-130731 | 5/1997 |
| JP | 10-70703 | 3/1998 |

* cited by examiner

*Primary Examiner*—Tuan Ho
(74) *Attorney, Agent, or Firm*—Frommer Lawrence & Haug LLP; William S. Frommer; Thomas F. Presson

(57) ABSTRACT

When an animation mode is designated, still picture data that has been photographed or discretely read from a record medium is compressed in a subtractive color process and a data compressing process corresponding to the LZW method. The compressed data is converted into an animation GIF file of which still picture data is combined in the time sequence and it is correlatively displayed on the time base. When an animation mode completion command is input or the size of the GIF file becomes a recordable size of the external storage medium 8, the GIF file data is written to the external storage medium 8. In addition, after a photographed still picture is recorded to the external storage medium 8, an animation can be created. In addition, an animation GIF file can be created using a plurality of still pictures recorded in the external storage medium 8. In addition, an animation GIF file that has been created can be edited.

35 Claims, 11 Drawing Sheets

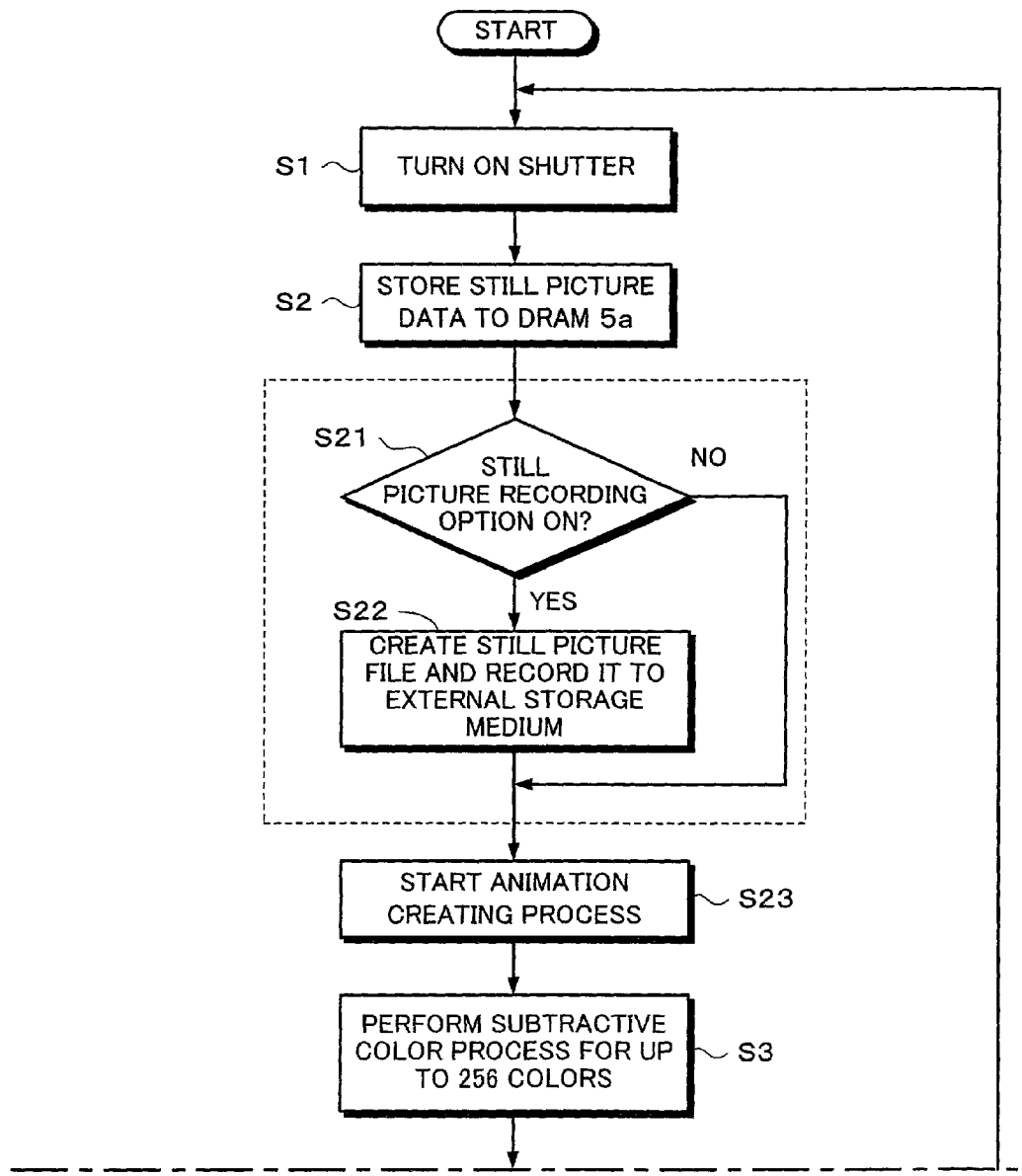

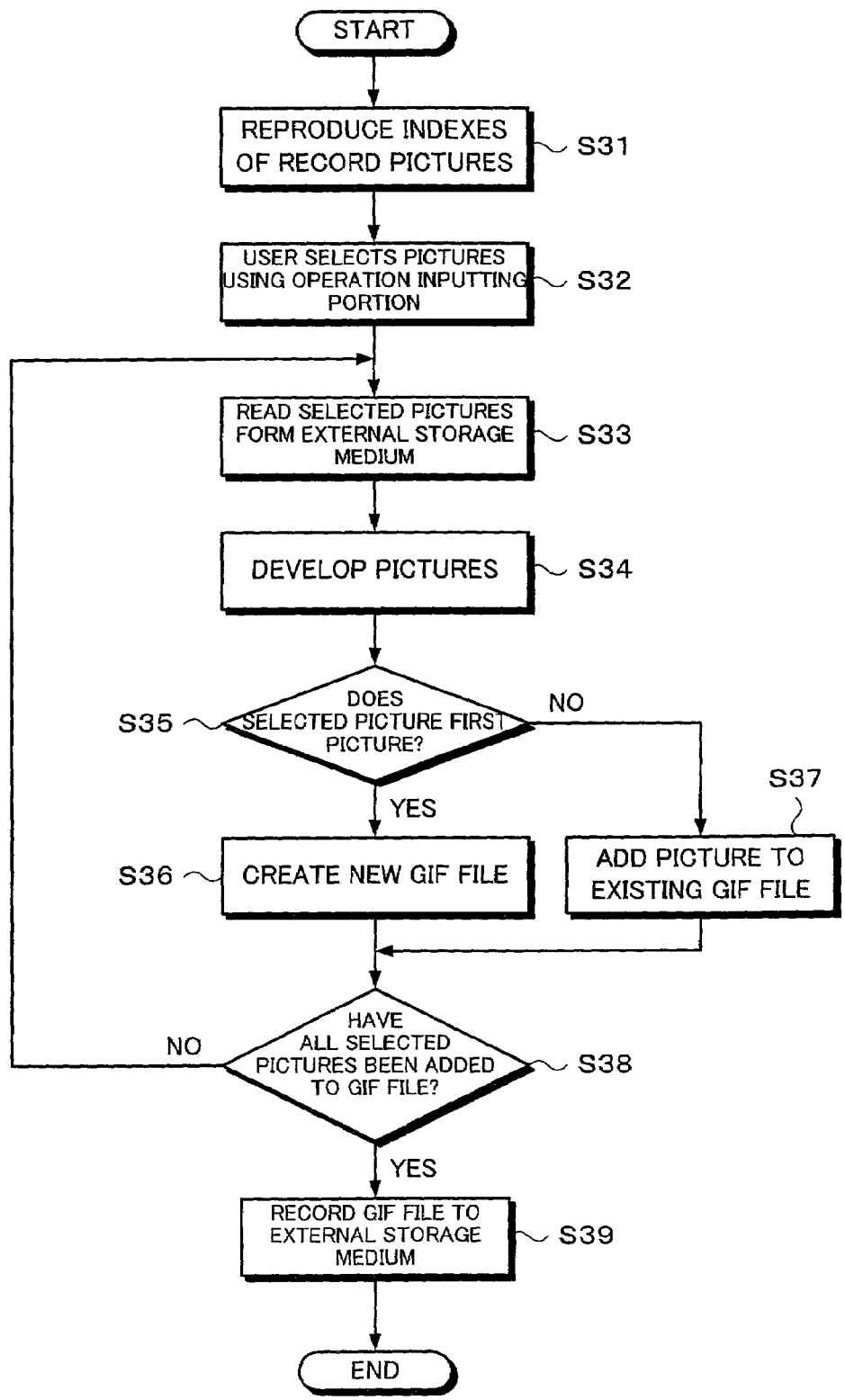

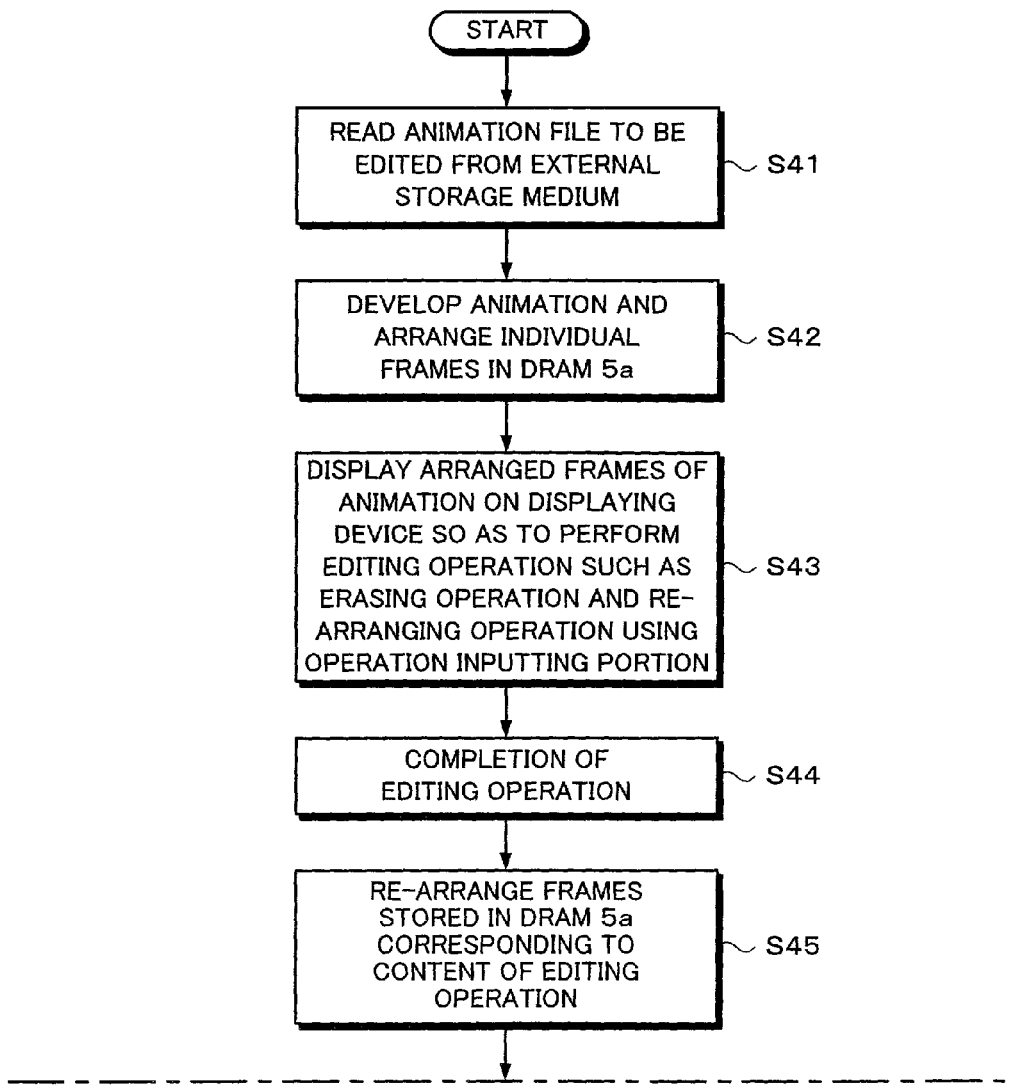

PHOTOGRAPHING APPARATUS AND SIGNAL PROCESSING METHOD THAT ALLOW DATA OF STILL PICTURES TO BE CONVERTED INTO A MOVING PICTURE FILE

TECHNICAL FIELD

The present invention relates to a photographing apparatus and a signal processing method suitable for a picture recording apparatus such as a digital camera for recording a photographed picture to an external storage medium.

RELATED ART

Recently, a digital camera apparatus that records an object image as picture data to a record medium such as a non-volatile semiconductor storing device (for example, flash memory), a hard disk, or a floppy disk) instead of a silver salt film is becoming common. A digital camera apparatus converts a photographed object image into a digital picture signal, compresses the converted digital picture signal, and records the compressed picture information to a record medium.

A digital camera apparatus using a 3.5-inch floppy disk as a record medium is handy since a photographed picture can be easily input to a personal computer. In addition, a particular digital camera apparatus can record a moving picture. In such apparatus, a sequence of pictures is recorded in the MPEG (Moving Picture Experts Group) format.

On the other hand, an animation corresponding to the GIF (Graphics Interchange Format) that is a graphics storing format has been widely used for moving pictures of home pages. To create an animation corresponding to the GIF format, a plurality of still pictures as files should be captured to a personal computer. In addition, a special application (animation software) should be used on the personal computer.

Although the above-described MPEG moving picture is suitable recorded for a single moving picture, it has not been widely supported on the network. Thus, such a moving picture cannot be suitably pasted on a home page and attached to an electronic mail. In addition, such a moving picture is not suitable for an animation of which discrete still pictures are successively displayed (as if pictures were ruffled). To solve such a program, an animation in the GIF format may be used. However, in such a case, particular software should be used on a personal computer. In reality, a plurality of still pictures is photographed by a digital camera apparatus. The still pictures are successively captured as picture files to the personal computer. Thereafter, a complicated process for combining the files should be performed on the personal computer using such software.

When photographed pictures are recorded as still pictures as well as an animation in the GIF format, the user does not need to perform a selecting operation for them.

In addition, when an animation can be created using still pictures that have been recorded in an external storage medium as well as newly photographed still pictures, a variety of materials can be preferably used for creating an animation.

Moreover, when an editing operation is performed for an animation recorded on an external storage medium (for example, when a particular frame is erased or the order of frames is changed), a difficult operation is required on a personal computer using a particular application.

Therefore, an object of the present invention is to provide a photographing apparatus and a signal processing method that allow data of a plurality of still pictures having been discretely recorded to be converted into a moving picture file of which the still pictures are correlatively displayed on the time base with an easy operation and an internal process of the apparatus, the format of the moving picture file being widely used in personal computers.

DISCLOSURE OF THE INVENTION

To solve the above-described problem, the invention of claim 1 is a photographing apparatus for generating a picture signal with a photograph signal and outputting the generated picture signal, comprising:
  a photographing means;
  a picture signal generating means for generating a picture signal with a photograph signal photographed by the photographing means;
  a storing means for storing the picture signal generated by the picture signal generating means;
  a controlling means for converting the picture signal stored in the storing mans into a moving picture signal that allows a plurality of discrete still pictures to be correlatively displayed on the time base; and
  an outputting means for outputting the moving picture signal.

The invention of claim 21 is a signal processing method for generating a picture signal with a photograph signal and outputting the picture signal, comprising the steps of:
  photographing an object;
  generating a picture signal with a signal of the photographed object;
  storing the picture signal;
  converting the picture signal into a moving picture signal that allows a plurality of discrete still pictures to be correlatively displayed on the time base; and
  outputting the moving picture signal.

According to the present invention, for example, in a GIF animation mode, a subtractive color process and a data compressing process corresponding to the LZW method are performed. In addition, the resultant data is converted into a GIF file of which data of a plurality of discrete still pictures is correlatively displayed on the time base. As a result, GIF file format data is output. The output data is written to for example an external storage medium. When the data is captured to a personal computer through the external storage medium, a photographed picture of a digital camera can be used for a home page and an electronic mail.

BRIEF DESCRIPTION OF DRAWINGS

FIG. 7 is a flow chart for explaining the third embodiment of the present invention.

BEST MODES FOR CARRYING OUT THE INVENTION

Figure 1:
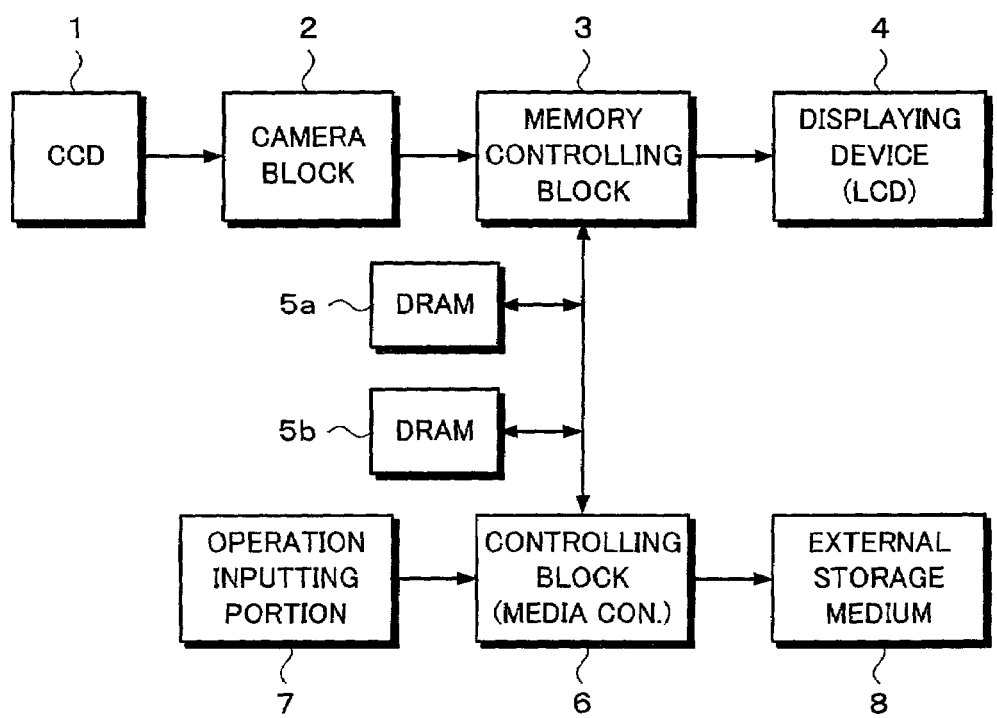
FIG. 1 is a block diagram showing the overall structure of an embodiment (first embodiment) of the present invention.

Next, with reference to the accompanying drawings, an embodiment (first embodiment) of the present invention will be described. FIG. 1 shows the overall structure of the embodiment. Referring to FIG. 1, a digital camera apparatus according to the first embodiment comprises a CCD 1, a camera block 2, a memory controlling block 3, a displaying device 4, DRAMs (Dynamic Random Access Memories) 5a and 5b, a controlling block 6, an operation inputting portion 7, and an external storage medium 8. The DRAM 5a and 5B can be accomplished by one DRAM when it has two memory areas.

The number of pixels (the number of horizontal pixels× the number of vertical pixels) of the CCD 1 is for example (1600×1280) in UXGA. In comparison with the number of picture of a photographed picture (color picture), the number of pixels of a record picture can be selected from (1280× 1024) in SXGA, (1024×768) in XGA, and (640×480) in VGA as well as (1600×1280) in UXGA. The CCD 1 outputs an object image photographed through a lens portion (not shown) as a photograph signal. The lens portion performs an automatic aperture controlling operation and an automatic focus controlling operation. The photograph signal is supplied to the camera block 2.

It should be noted that the present invention is not limited to the case that a processed picture is recorded to an external storage medium. In addition, the present invention can be applied to the case that a processed picture is transmitted to a communication medium.

The CCD 1 has two selectable modes that are an all-pixel reading mode (photograph mode) and a line thin-out mode (E to E mode) for decreasing the number of lines by ⅓. The E to E mode is used to display data of a photographed picture to the displaying device 4 rather than to record it to a record medium (DRAM). In the E to E mode, when a picture is photographed, the angle of view is determined. In addition, the focus, exposure, and white balance are properly adjusted. In other words, in the E to E mode, the object is checked before the shutter button is pressed in the photograph mode. For example, in the photograph mode, a photograph signal of 20 fields per second is output. In the E to E mode, a photograph signal of 60 fields per second is output.

The camera block 2 comprises a clamp circuit, a luminance signal processing circuit, a contour compensating circuit, a defect compensating circuit, and an automatic white balance compensating circuit. For example, the camera block 2 generates a digital photograph signal as component signals composed of a luminance signal and color difference signals converted from RGB signals. The digital photograph signal is supplied to the memory controlling block 3.

The memory controlling block 3 comprises a signal switching portion, a display buffer memory, and a D/A converter. The displaying device 4 and a data transmission path are connected to the memory controlling block 3. The memory controlling block 3 supplies the generated RGB signals to the displaying device 4 through the D/A converter.

The displaying device 4 is composed of a displaying device integrally disposed on the camera. The displaying device is for example an LCD (Liquid Crystal Display). The output picture signal of the camera block 2 is supplied to the displaying device 4. Thus, a picture that is being photographed is displayed. In addition, a picture that is supplied from the external storage medium 8 through the data transmission path is displayed. The displaying device 4 can display a VGA (640×480) picture.

The DRAMs 5a and 5b and the controlling block 6 (composed of a microcomputer) are connected to the data transmission path. The DRAMs 5a and 5b are controlled by the memory controlling block 3 or the controlling block 6. The DRAM 5a stores an original picture received through the memory controlling block 3. The DRAM 5b stores picture data that has been processed by the controlling block 6.

The operation inputting portion 7 and the external storage medium 8 are connecte to the controlling block 6 through respective interfaces. Corresponding to control information supplied from the controlling block 6 to individual structural portions, picture data is processed. The resultant data is written and read to/from the DRAMs 5a and 5b. In addition, the resultant data is written and read to/from the external storage medium 8.

The operation inputting portion 7 comprises a shutter button, a mode designation switch, cursor movement keys, an execution key, and other various switches operated by the user (photographer). The external storage medium 8 is for example a memory card (IC card), a floppy disk, or a rewritable optical disc. The external storage medium 8 can be attached and detached to/from the camera main body. Besides the external storage medium 8, a communication medium such as Internet can be used.

An encoder/decoder portion of the controlling block 6 compresses (encodes) and decompresses (decodes) picture data in a predetermined format. For example, when still picture data is processed in the normal photograph mode, data is compressed in the JPEG (Joint Photographic Experts Group) format. In the animation mode, the encoder/decoder portion performs a subtractive color process for the picture data. Thereafter, the encoder/decoder portion compresses the picture data corresponding to the LZW (Lempel Ziv Welch) method and adds necessary structural elements to the compressed data so as to convert the picture data to a GIF file.

The interface portion of the controlling block 6 outputs a JPEG file (in the normal photograph mode) or a GIF file (in the animation mode) corresponding to a mode designated by the operation inputting portion 7 to the external storage medium 8.

According to the first embodiment that accomplishes such a structure, when a predetermined designation switch of the operation inputting portion 7 is operated, the normal photograph mode or the animation mode can be designated. For example, when the shutter button is pressed in the normal photograph mode, an object image is D/A-converted into a digital picture signal. The resultant still picture data of one still picture is temporarily written to the DRAM 5a. The still picture data is read from the DRAM 5a and compressed in the JPEG format. After the data is compressed in the JPEG format, the resultant JPEG file data is stored to the DRAM 5b. Thereafter, the JPEG file data is output and written to the external storage medium 8.

On the other hand, when the shutter button is pressed in the animation mode, as with in the normal photograph mode, an object image is A/D-converted into a digital picture signal. The resultant still picture data of one still picture is temporarily stored to the DRAM 5*a*.

Thereafter, still picture data is read from the DRAM 5*a*. The subtractive color process is performed for the still picture data. Next, the resultant data is compressed corresponding to the LZW method. After the data is compressed, the resultant data is combined in the time sequence as an animation GIF file corresponding to the write state of the DRAM 5*b*.

In reality, when a GIF file has been stored in the DRAM 5*b*, the current still picture data is converted in such a manner that the current still picture data is combined after the preceding still picture data in the time sequence and they are correlatively displayed on time base. The resultant still picture data is stored to the DRAM 5*b*. When a GIF file has not been stored in the DRAM 5*b*, a GIF file is newly created corresponding to the current still picture data. The created file data is stored to the DRAM 5*b*. When the animation mode is completed corresponding to an operation of the operation inputting portion 7 or when the size of the GIF file becomes a recordable size of the external storage medium 8, the file data stored in the DRAM 5*b* is written to a predetermined area of the external storage medium 8.

The animation GIF file stored in the external storage medium 8 is reproduced. The reproduced file is decoded by the controlling block 6. The decoded picture is stored to the DRAM 5*a*. As a result, the displaying device 4 can reproduce an animation. The picture size of each frame composing the obtained animation GIF file is smaller than the normal record picture size such as VGA. When the displaying device 4 reproduces an animation, it displays each frame in the small size or a picture enlarged by the memory controlling block 3 or the controlling block 6.

Figure 2:
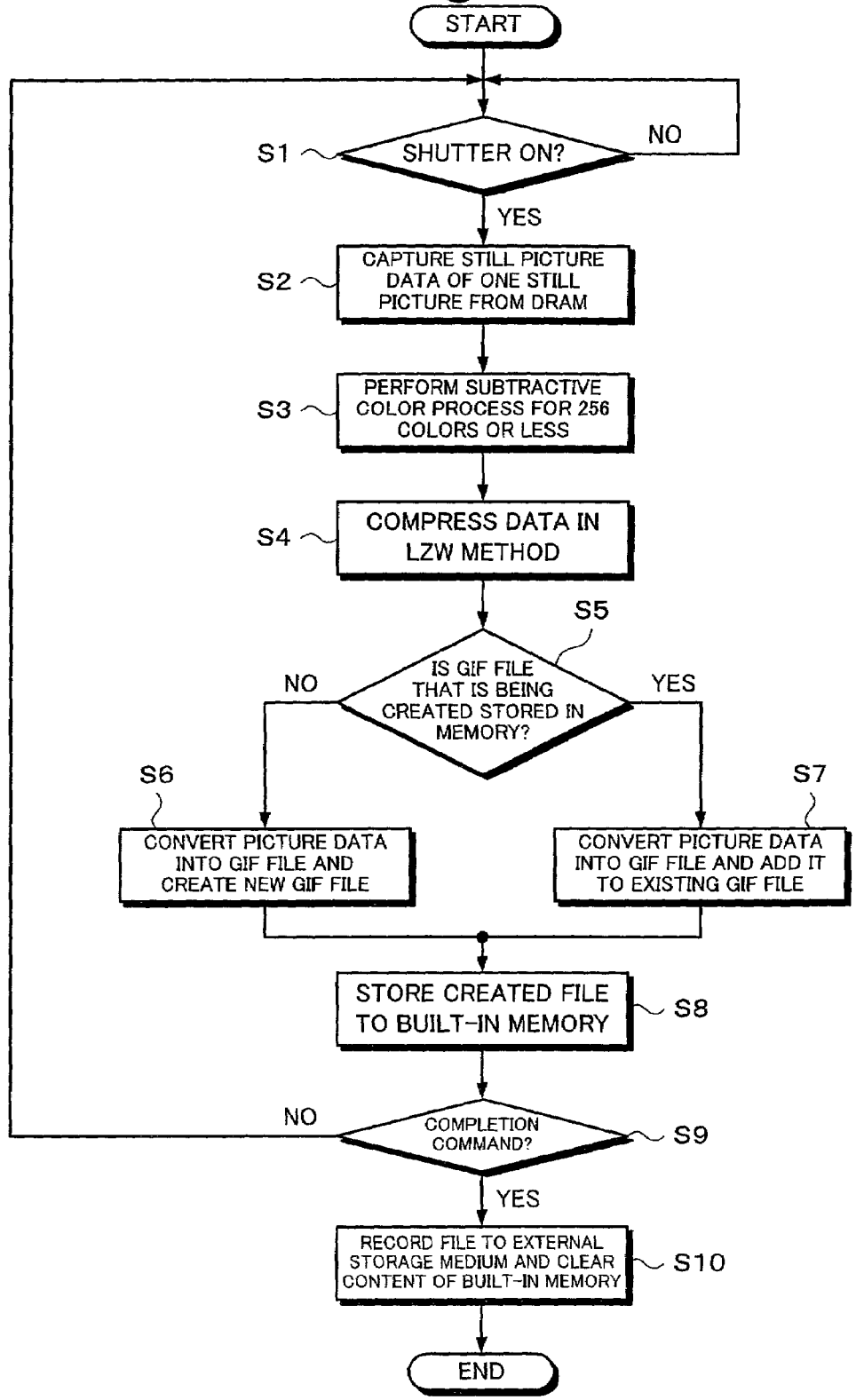
FIG. 2 is a flow chart for explaining the first embodiment of the present invention.

Next, the operation of the animation mode according to the first embodiment of the present invention will be described. FIG. 2 shows a picture capturing process and a GIF file (animation GIF file) converting process. At step S1, it is determined whether or not the shutter has been pressed. When the determined result at step S1 is Yes (namely, the shutter has been pressed), the flow advances to step S2. At step S2, picture data of one picture is temporarily written from the memory controlling block 3 to the DRAM 5*a*.

After the picture data is written to the DRAM 5*a*, the still picture data is read from the DRAM 5*a*. The still picture data is compressed as a pre-process for the GIF format converting process. In other words, the subtractive color process is performed for the still picture data (at step S3). In the case, the still picture data is converted into data having a predetermined number of colors (for example, 256 colors or 16 colors).

After the subtractive color process is completed at step S3, the flow advances to step S4. At step S4, the resultant data is compressed corresponding to the LZW method. In other words, at steps S3 and S4, the data amount of the still picture data is remarkably reduced to data having a predetermined data amount.

After the data compressing process at step S5*a* and S5*b* are completed, the flow advances to step S5. At step S5, it is determined whether or not a GIF file that is being created is stored in a memory (DRAM 5*b*). When the determined result at step S5 is No (namely, a GIF file that is being created is not stored in the memory), the flow advances to step S6. At step S6, various types of information are added to the picture data so as to satisfy the structure of a GIF file. As a result, a new file is created.

As will be described later, a GIF file is composed of a header block, a logical screen descriptive block, a global color table block, an animation extension block, a graphic control extension block, an image data block, and a trailer block. When an animation file is created, the graphic control extension block and the mage data block are repeatedly placed corresponding to the number of pictures. At last, a trailer block is added. In such a manner, an animation file is created.

On the other hand, when the determined result at step S5 is Yes (namely, a GIF file that is being created is stored in the DRAM 5*b*), the flow advances to step S7. At step S7, the picture data is converted into a GIF file. In other words, a GIF file is added after the existing GIF file. In reality, as was described above, a graphic control extension block and an image data block are added. In such a manner, picture data is converted into an animation file of which still picture data that is discretely captured is combined in the time sequence and it is correlatively displayed on the time base.

After the new file creating process is completed at step S6 or the file adding process is completed at step S7, the flow advances to step S8. At step S8, the processed file is stored to a built-in memory (DRAM 5*b*). Thereafter, the flow advances to step S9. At step S9, it is determined whether or not an animation mode completion command has been input corresponding to an operation of the operation inputting portion 7 or the size of the GIF file (animation file) becomes a recordable size of the external storage medium 8.

When the determined result at step S9 is No (namely, the animation mode completion command has not been input or the size of the GIF file does not become the recordable size of the external storage medium 8), the flow returns to step S1. Until the shutter button is pressed, a standby state takes place. When the shutter button is pressed, the loop from steps S1 to S9 (except for step S6) is repeated until the animation mode completion command is input or the size of the GIF file becomes the recordable size of the external storage medium 8.

When the determined result at step S9 is Yes (namely, the animation mode completion command has been input or the size of the GIF file becomes the recordable size of the external storage medium 8), the flow advances to step S10. At step S10, the GIF file is output and stored to the external storage medium 8. After the recording process for the external storage medium 8 is completed, the GIF file stored in the DRAM 5*b* is erased. Since the animation file data is recorded to the external storage medium 8, the animation GIF converting process is completed. In that state, when the shutter button is pressed, a new file is created at step S6. Thereafter, the similar process is performed.

Figure 3:
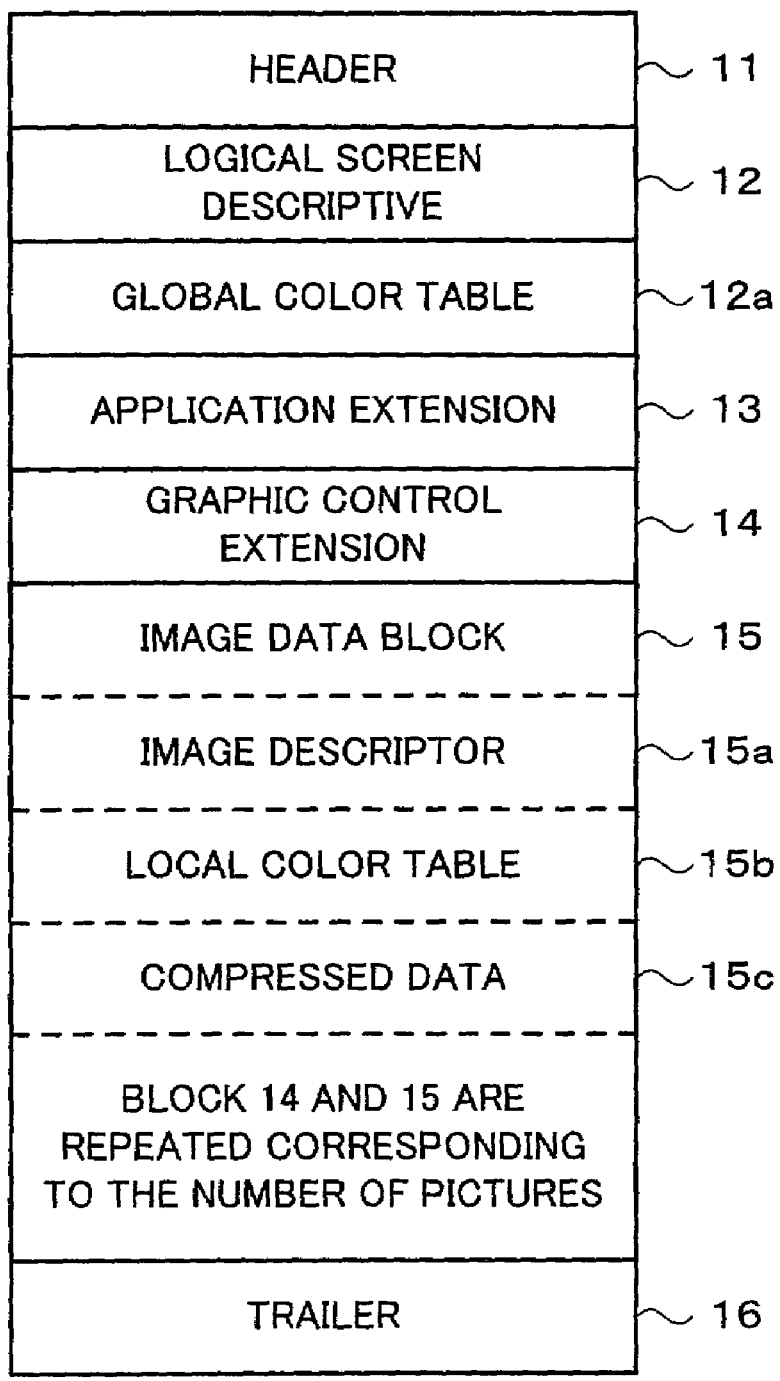
FIG. 3 is a schematic diagram showing the structure of a GIF file according to the first embodiment of the present invention.

Next, the file structure of the above-described GIF file and the functions and definitions of each portions thereof will be described. FIG. 3 shows an example of the file structure of a conventional GIF file. Referring to FIG. 3, a GIF file is mainly composed of a header block 11, a logical screen descriptive block 12, an application extension block 13, a graphic control extension block 14, an image data block 15, and a trailer block 16. In other words, by creating those blocks, a GIF file can be created. A header block 11 is composed of for example six bytes. The header block 11 is placed at the beginning of a GIF file. The header block 11 represents that the current data stream corresponds to the GIF format. The header block 11 is composed of a signature field and a version field. The signature field represents the beginning of the data stream. The version field is necessary for completely performing a decoding process. One header block should be placed for one data stream.

A header block 11 is followed by a logical screen descriptive block 12. The logical screen descriptive block 12 defines parameters (size, aspect ratio, and color depth) necessary for defining an area of an image plane (display device) for rendering an image. The logical screen descriptive block 12 defines various parameters such as a parameter that represents the presence/absence of a global color table. One logical screen descriptive block 12 should be placed for one data stream.

The logical screen descriptive block 12 is followed by a global color table block 12*a*. The color table is a palette that represents RGB values (three bytes=24 bits) of all colors of a picture. Since the GIF supports up to 256 colors, the global color table is composed of up to 256×3 bytes. That global color palette is a default palette that is used when a local palette dedicated for an image is not used. Although a logical screen descriptive block 12 is optional, only one global color table can be used for one data stream.

A global color table block 12*a* is followed by an application extension block 13. The application extension block 13 contains unique information that allows only a particular application to perform a special process for image data.

An application extension block 13 is followed by a graphic control extension block 14. The graphic control extension block 14 contains a parameter for controlling an image displaying method. The parameter only affects an image that is preceded by the graphic control extension block 14. A GIF file can be composed without need to use a graphic control extension block 13. Only one graphic control extension block 14 can be followed by image data. The graphic control extension block 14 can contain a parameter that represents display intervals of individual frames of an animation file.

A graphic control extension block 14 is followed by an image data block 15. Each image of a data stream is composed of an image descriptor block 15*a*, a local color table block 15*b* (optional), and compressed data 15*c*.

The image descriptor block 15*a* contains a parameter necessary for processing an image corresponding to a color table. Coordinates designated by an image descriptor block 15*a* represent coordinates of a logical screen (in pixels). The image descriptor block 15*a* is a graphic rendering block that may be preceded by one or more control blocks such as a graphic limitation extension block or may be followed by a local color table. An image descriptor block 15*a* is always followed by compressed data. In other words, an image descriptor block 15*a* is required for an image. Only one image descriptor can be designated for an image contained in one data stream. However, the number of images that are contained in a data stream is not limited.

As with the above-described global color table block 12*a*, a local color table block 15*b* is composed of a sequence of bytes that represent combinations of three colors of RGB. The local color table block 15*b* is a color palette that only affects the following image.

Compressed data 15*c* corresponding to a color table is composed of a sequence of sub blocks. Each sub block of compressed data 15*c* is composed of up to 255 bytes. Each sub block contains an index corresponding to a color table.

Graphic control extension blocks 14 and image data blocks 15 are repeated corresponding to the number of successive pictures. At the end of a GIF file, a trailer block 16 is placed. In such a structure, an animation file is created. The trailer block 16 is a block composed of a single field that represents the end of a GIF data stream. A GIF file is always completed with a trailer block 16.

Figure 4A:
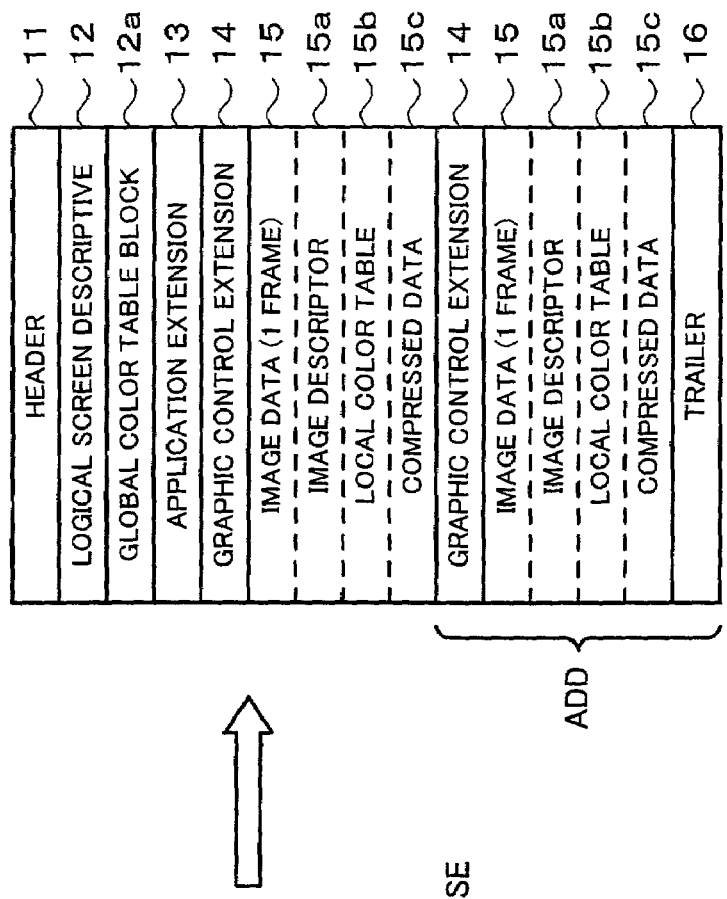
FIG. 4 is a schematic diagram for explaining the first embodiment of the present invention.
Figure 4B:
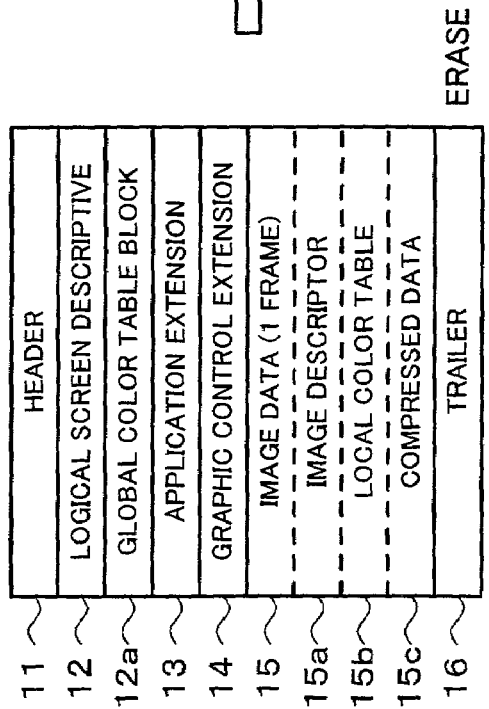

Next, a newly creating process and a file adding process for a GIF file will be described in reality. FIG. 4A shows the structure of a GIF file in the newly creating process (at step S6 shown in FIG. 2). FIG. 4B shows the structure of a GIF file in the adding process (at step S7 shown in FIG. 2).

When a GIF file is newly created, all a header block 11, a logical screen descriptive block 12, an application extension block 13, a graphic control extension block 14, a data block 15, and a trailer block 16 are structured as shown in FIG. 4A. When picture data of a second picture is added, a trailer block 16 is erased. Thereafter, a graphic control extension block 14 and an image data block 15 are added for the added still picture data. Thereafter, a new trailer block 16 is added.

As a result, a GIF file shown in FIG. 4B is created. By repeating the above-described operation, data of a plurality of still pictures is converted into an animation. In other words, still picture data is converted into an animation GIF file of which discretely captured still picture data is combined in the time sequence and it is correlatively displayed on the time base.

According to the first embodiment of the present invention, still picture data is converted into an animation GIF file of which discretely captured still picture data is combined in the time sequence and it is correlatively displayed on time base corresponding to a designated state. Thus, the digital camera apparatus can be used for wide applications. In addition, according to the present invention, since a photographed picture is converted into GIF file format as an inner process of the picture recording apparatus, it is not necessary to perform a complicated operation using software on a personal computer. In addition, animated data can be recorded to an external storage medium and transmitted. Thus, a photographed picture can be easily and quickly used for a home page and an electronic mail.

Figure 5B:
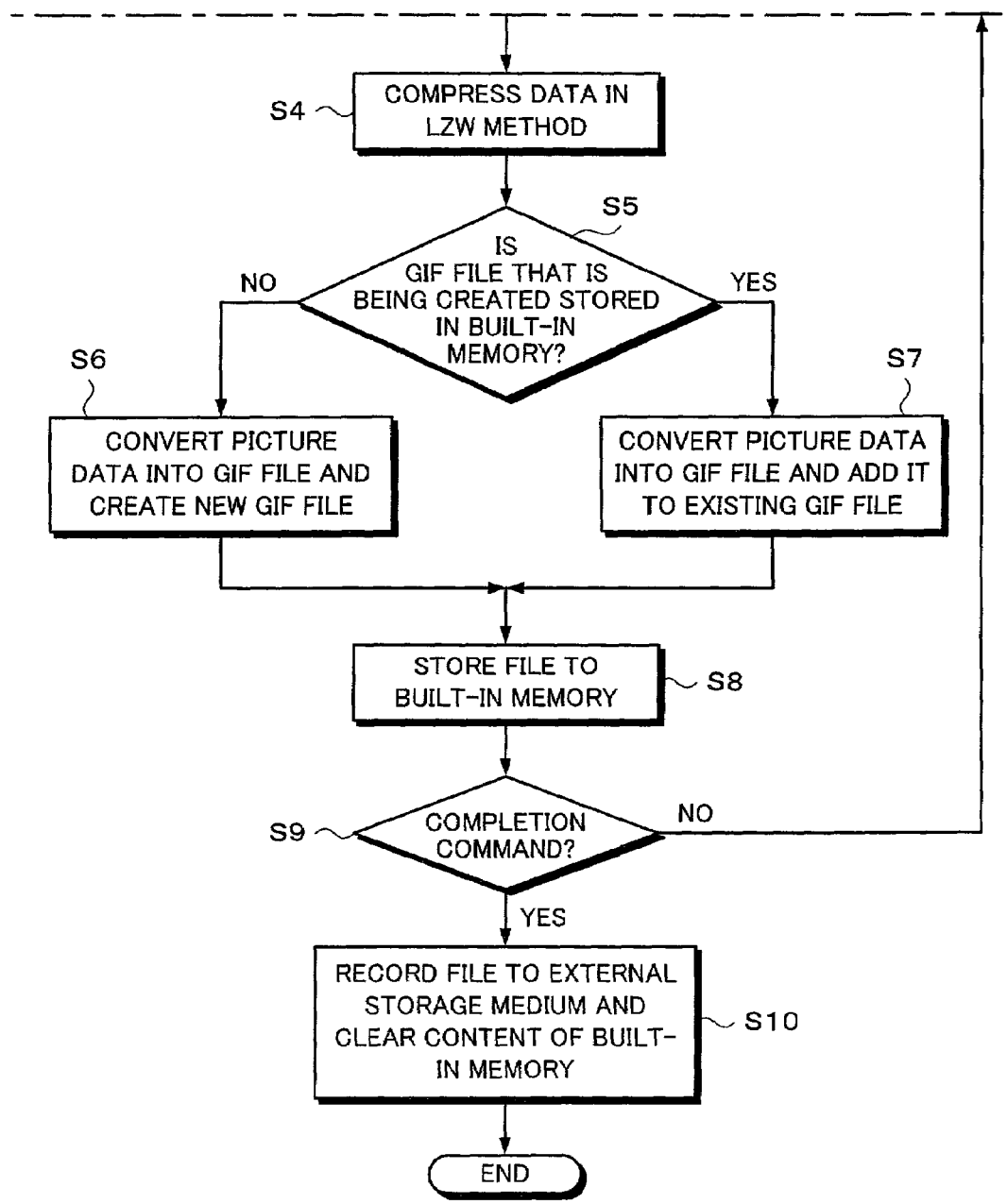
FIG. 5 is a flow chart for explaining another embodiment (as a second embodiment) of the present invention.

Next, another embodiment of the present invention will be described. Hereinafter, this embodiment will be referred to as second embodiment. According to the second embodiment of the present invention, while an animation GIF file is being created, a still picture file is recorded. In more reality, before an animation GIF file is created, a photographed picture is recorded as one still picture to the external storage medium 8. The photographing apparatus system according to the second embodiment is the same as that shown in FIG. 1. However, the control performed by the controlling block 6 is performed as shown in FIGS. 5A and 5B. As a result, a still picture file can be recorded. The flow charts shown in FIGS. 5A and 5B are a first part and a second part, respectively, of one process because of a limited space. In the following description, the first part and the second part shown in FIGS. 5A and 5B are not distinguished.

At steps S1 and S2 shown in FIG. 5, a photographed picture is stored to the DRAM 5*a*. At step S21, it is determined whether or not the user has selected a still picture recording option. When the determined result at step S21 is Yes (namely, the user has selected the still picture recording option), the flow advances to step S22. At step S22, a still picture file is created. The created still picture file is recorded to the external storage medium 8. Thereafter, the flow advances to step S23. At step S23, the animation creating process gets started. When the determined result at step S21 is No (namely, the user has not selected the still picture recording option), the flow advances to step S23 skipping step S22.

At step S22, the still picture stored in the DRAM 5*a* is converted into a still picture file in for example the JPEG format by the encoder/decoder portion of the controlling block 6. The still picture file is stored to the DRAM 5*b*. The controlling block 6 records the still picture file to the external storage medium 8. Although the still picture file is stored to the DRAM 5*b*, the original picture data is stored in the DRAM 5*a*. Thus, the original picture data can be used for creating an animation GIF file.

Since steps other than steps S21 and S22 in a dotted box in FIG. 5A are the same as those of the first embodiment (see the flow chart shown in FIG. 2), similar reference numerals to those are denoted by similar reference step numerals and their description is omitted. According to the second embodiment, not only a captured picture can be converted into an animation, but the captured picture can be recorded as one still picture. The external storage medium 8 can record both an animation GIF file and still picture files (JPEG files) of individual frames of the animation. Those files are recorded so that they can be distinguished with file names and extensions defined corresponding to the external storage medium 8. Thus, the user can conveniently use those files for later editing operations. When that function is optionally provided, if the storage capacity of the external storage medium 8 runs out, the still picture recording function can be turned off. Thus, only an animation GIF file can be recorded. Consequently, the storage capacity of the external storage medium 8 can be prevented from being wasted.

Next, a further other embodiment (referred to as third embodiment) of the present invention will be described. According to the third embodiment, by combining a plurality of still pictures that have been recorded in the external storage medium 8, an animation is created. In the system shown in FIG. 1, in the regular reproducing operation, compressed picture files (for example, JPEG files) are read from the external storage medium 8 and decompressed by the controlling block 6. The decompressed pictures are stored to the DRAM 5*a* and reproduced by the displaying device 4.

According to the third embodiment, index pictures of still pictures are recorded in the external storage medium 8. For example, thumbnails of which the size of each recorded picture is reduced is recorded as indexes. Thumbnails have been also compressed in the JPEG format. When the index reproducing operation is designated, thumbnails are read from the external storage medium 8 and displayed on the displaying device 4.

Figure 6A:
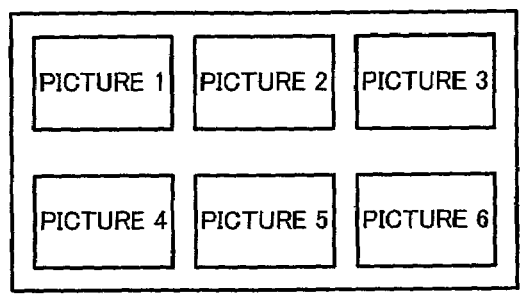
FIG. 6 is a schematic diagram for explaining another embodiment (as a third embodiment) of the present invention.

Next, with reference to FIGS. 6 and 7, a process for combining a plurality of still pictures that have been recorded in the external storage medium 8 and creating an animation will be described. As shown in FIG. 6A, thumbnails are read from the external storage medium 8. Indexes are displayed on the displaying device 4 (at step S31 shown in FIG. 7). For example, six thumbnails of pictures 1 to 6 are displayed.

Figure 6B:
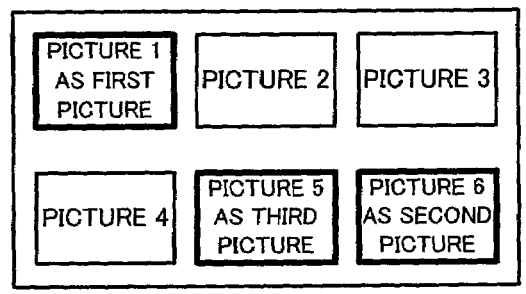

At step S32, the user selects pictures using the operation inputting portion 7. In FIG. 6B, thumbnails that have been selected are denoted by thick line boxes (pictures 1, 6, and 5). When a thumbnail is selected, the color of the frame thereof may be changed. The selection order of thumbnails becomes the order of pictures of an animation. The selecting operation and the order designating operation for pictures may be performed with a menu displayed on the screen of the displaying device 4.

The controlling block 6 reads selected pictures from the external storage medium 8 corresponding to the selecting operation of the operation inputting portion 7. A compressed picture (JPEG file) corresponding to the selected picture 1 is stored to the DRAM 5*b* (at step S33). The controlling block 6 decodes the picture and stores the decoded picture to the DRAM 5*a*. The decoding process and the storing process for the DRAM 5*a* are performed at step S34 (develop picture.) shown in FIG. 7.

Thereafter, at step S35, it is determined whether or not the selected picture is the first picture. When the determined result at step S35 is Yes (namely, the selected picture is the first picture), the flow advances to step S36 (create new GIF file). The created GIF file is stored to the DRAM 5*b*. Thereafter, at step S38, it is determined whether or not all the selected pictures have been added to the GIF file. When the determined result at step S35 is Yes (namely, the selected picture is the first picture), the determined result at step S38 is No. Thus, the flow returns to step S33. For the second picture, the same process as the first picture is performed. However, after step S35, step S37 (add picture to existing GIF file.) is performed.

Figure 6C:
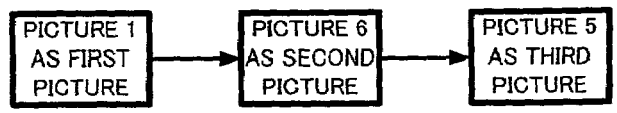

When three pictures have been selected, after step S37 (at which the third picture is processed), the determined result at step S38 becomes Yes. Thus, the flow advances to step S39. At step S39, the GIF file (animation GIF file) stored in the DRAM 5*b* is recorded to the external storage medium 8 under the control of the controlling block 6. As a result, the process is completed. In such a manner, as shown in FIG. 6C, an animation composed of the pictures 1, 6, and 5 in succession is created. Thus, in an inner process of the digital picture recording apparatus, an animation can be easily created.

Next, with reference to FIGS. 8 and 9, a further different embodiment (referred to as fourth embodiment) of the present invention will be described. According to the fourth embodiment, an animation recorded in the external storage medium 8 can be edited. The flow charts shown in FIGS. 9A and 9B are a first part and a second part, respectively, of one process because of a limited space. In the following description, the first part and the second part shown in FIGS. 9A and 9B are not distinguished.

At step S41 shown in FIG. 9, an animation GIF file is read from the external storage medium 8. At step S42, the animation GIF file that is read from the external storage medium 8 is stored to the DRAM 5*b*. The animation GIF file is decoded by the controlling block 6. The decoded picture data is stored to the DRAM 5*a*. In that case, when necessary, the controlling block 6 reduces the size of each picture of the animation GIF file.

Figure 8A:
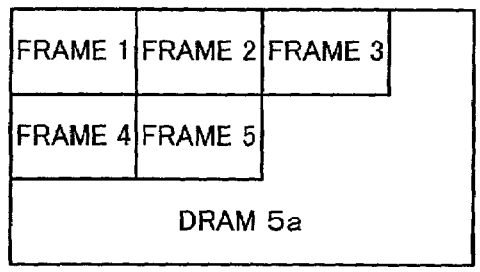
FIG. 8 is a schematic diagram for explaining another embodiment (as a fourth embodiment) of the present invention.
Figure 9B:
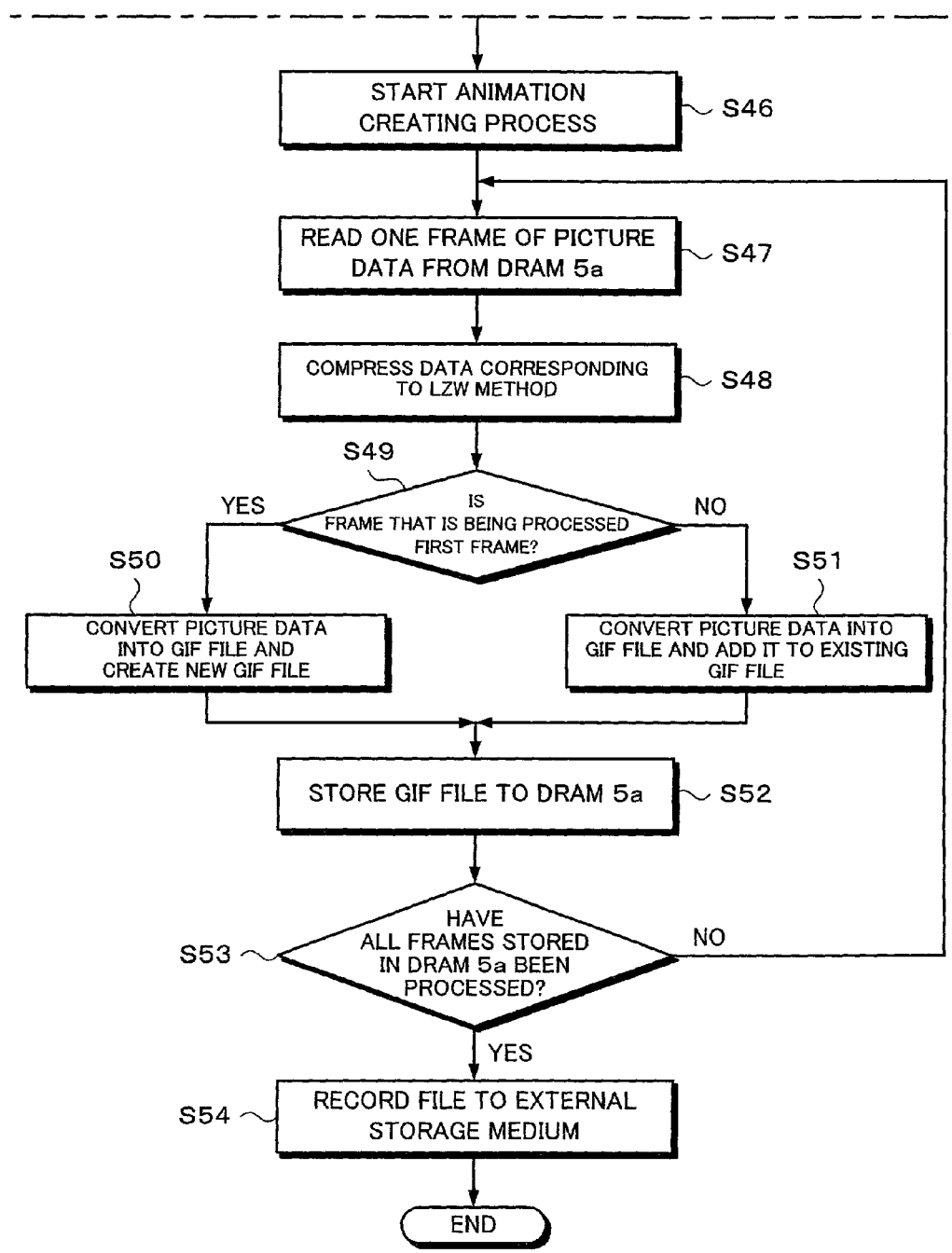
FIG. 9 is a flow chart for explaining the fourth embodiment of the present invention.

FIG. 8A shows that five pictures (frames 1 to 5) that compose an animation are stored in the DRAM 5*a*. At step S43, as with the case shown in FIG. 8A, five frames are displayed on the screen of the displaying device 4 at a time. In that state, the user can perform an editing operation (such as an erasing operation, a re-arranging operation, or an adding operation) using the operation inputting portion 7. For example, the cursor movement keys and the execution key are used for editing the frames displayed on the displaying device 4. In addition, an edit menu or the like is displayed on the screen.

Figure 8B:
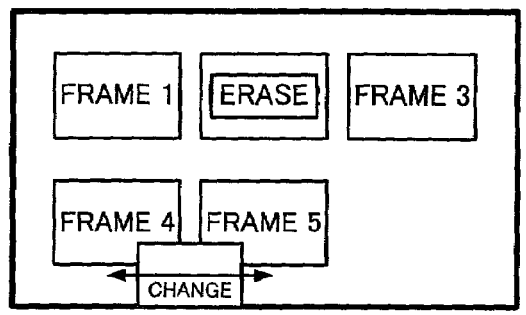

FIG. 8B shows an example of an editing operation. In FIG. 8B, an editing operation is performed in such a manner that the frame 2 is erased and the order of the frame 4 and the frame 5 is changed. The content of the editing process (including editing steps) is stored in the controlling block 6. At step S44 shown in FIG. 9, after the editing operation is completed, the controlling block 6 re-arranges the frames stored in the DRAM 5*a* corresponding to the content of the editing operation.

Figure 8C:
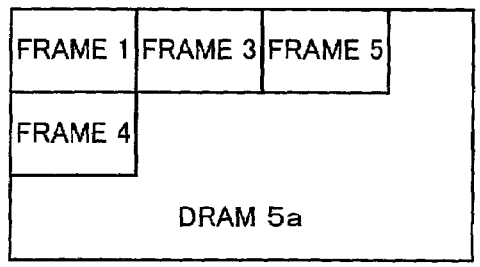

In the case of the content of the editing operation shown in FIG. 8B, frames stored in the DRAM 5*a* are re-arranged as shown in FIG. 8C. In that case, it is not necessary to rewrite the content stored in the DRAM 5*a* shown in FIG. 8A to that shown in FIG. 8C. Instead, corresponding to the content of the editing operation stored in the controlling block 6, data is read from the DRAM 5*a*. In the example of the content of the editing operation, the reading operation of the picture of the frame 2 is skipped. The reading order of the data of the frame 4 and the data of the frame 5 is changed.

The animation creating process is performed for the picture data that is read from the DRAM 5*a* (at step S46). The rest of the process is the same as that of the above-described GIF file converting process. In other words, picture data for one frame is read from the DRAM 5*a* (at step S47). The picture data is compressed corresponding to the LZW method (at step S48). It is determined whether or not the selected picture is the first picture (at step S49). The picture of the first frame is converted into a GIF file (at step S50). A frame of a second or later frame converted into a GIF file and added to the existing GIF file (at step S51). The GIF file (animation GIF file) is stored to the DRAM 5*b* (at step S52). When all frames stored in the DRAM 5*a* have been processed as the determined result at step S53, the edited animation GIF file is recorded to the external storage medium 8 (at step S54).

Figure 8D:
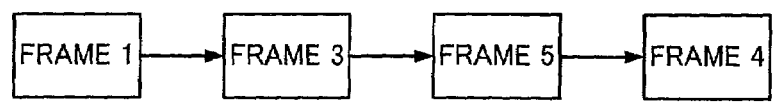

FIG. 8D shows the structure of an edited animation GIF file that is stored to the external storage medium 8. In other words, an animation GIF file of which the frame 2 has been erased and the order of the frame 4 and the frame 5 has been changed is obtained. The edited file is overwritten on the original file in the external storage medium 8. In such a case, the edited file may be recorded as a new file in the external storage medium 8.

According to the fourth embodiment of the present invention, since a created animation GIF file can be edited in the digital picture recording apparatus, a photographed picture can be erased or changed without need to use a personal computer. Thus, the user can easily create a desired animation.

It should be noted that the present invention is not limited to the above-described embodiments. Instead, without departing from the sprit of the present invention, various modifications and applications are available. For example, the present invention can be applied to a compression encoding method other than the GIF and JPEG. In addition, the present invention can be applied to a digital picture recording apparatus other than a digital camera. For example, the present invention can be applied to the case that a moving picture recording apparatus has a still picture recording function and the case that a portable personal computer that has a CCD processes a photographed picture.

The invention claimed is:

1. A photographing apparatus for generating a picture signal with a photograph signal and outputting the generated picture signal, comprising:\
    photographing means;
    picture signal generating means for generating a picture signal with a photograph signal photographed by said photographing means;
    storing means for storing the picture signal generated by said picture signal generating means;
    controlling means for converting the picture signal stored in said storing mans into a moving picture signal that allows a plurality of discrete still pictures to be correlatively displayed on the time base; and
    outputting means for outputting the moving picture signal;
    wherein said storing means also stores the moving picture signal received from aid controlling means; and
    wherein said storing means has at least two storage areas, a first storage area and a second storage area storing the Picture signal received from the picture signal generating means and the moving picture signal, respectively.

2. The photographing apparatus as set forth in claim 1, wherein said outputting mes directly outputs the still picture signal of a plurality of discrete pictures stored in said storing means rather than converting the still picture signal into the moving picture signal.

3. The photographing apparatus as set forth in claim 2, wherein the photographing apparatus writes the moving picture signal and the still picture signal that are output from said outputting means to an external storage medium.

4. The photographing apparatus as set forth in claim 2, wherein said controlling means converts the still picture signal into a JPEG (Joint Photographic Experts Group) file format.

5. The photographing apparatus as set forth in claim 1, wherein the photographing apparatus writes the moving picture signal that is output from said outputting means to an external storage medium.

6. The photographing apparatus as set forth in claim 1, further comprising:
    operation inputting means,
    wherein said controlling means converts the still picture signal into the moving picture signal corresponding to an input received from said operation inputting means.

7. The photographing apparatus as set forth in claim 6, wherein said controlling means combines the still picture signal of the plurality of discrete still pictures in the order corresponding to the input received from said operation inputting means.

8. The photographing apparatus as set forth in claim 6, wherein said controlling means combines the still picture signal of selected still pictures corresponding to the input received from said operation inputting means.

9. The photographing apparatus as set forth in claim 1, wherein said controlling means converts the still picture signal into a GIF (Graphics Interchange Format) file format.

10. The photographing apparatus as set forth in claim 1, wherein said controlling means combines the still picture signal of the plurality of discrete still pictures in the time sequence.

11. The photographing apparatus as set forth in claim 1, further comprising:
    inputting means for inputting a still picture signal,
    wherein said storing means stores the still picture signal that is input from said inputting means, and
    wherein said controlling means converts the still picture signal that is input from said inputting means into a moving picture signal that allows a plurality of discrete still pictures to be correlatively displayed on the time base.

12. The photographing apparatus as set forth in claim 11, wherein a still picture signal is input from an external storage medium to said inputting means.

13. The photographing apparatus as set forth in claim 11, wherein the photographing apparatus writes the moving picture signal that is output from said outputting means to the external storage medium.

14. The photographing apparatus as set forth in claim 11,
wherein said storing means stores the moving picture signal that is input from said inputting means, and
wherein said controlling means converts the moving picture signal into the original still picture signal of a plurality of discrete still pictures.

15. The photographing apparatus as set forth in claim 14, wherein said controlling means combines a plurality of still pictures and converts the still picture signal into a moving picture signal corresponding to the input received from said operation inputting means.

16. The photographing apparatus as set forth in claim 14, wherein a moving picture signal is input from an external storage medium to said inputting means.

17. The photographing apparatus as set forth in claim 1, further comprising:
displaying means,
wherein said displaying means displays a still picture signal stored in said storing means or a signal corresponding to the still picture signal.

18. The photographing apparatus as set forth in claim 17, wherein said displaying means displays an index signal of the still picture signal of the plurality of discrete still pictures.

19. A signal processing method for generating a picture signal with a photograph signal and outputting the picture signal, comprising the steps of:
photographing an object;
generating a picture signal with a signal of the photographed object;
storing the picture signal;
converting the picture signal into a moving picture signal that allows a plurality of discrete still pictures to be correlatively displayed on the time base; and
outputting the moving picture signal;
wherein the still picture signal of a plurality of discrete pictures stored is directly output without converting the still picture signal into the moving picture signal;
wherein the moving picture signal is input and stored, and
wherein the moving picture signal is converted into an original still picture signal of a plurality of discrete still pictures.

20. The signal processing method as set forth in claim 19, wherein the moving picture signal is written to an external storage medium.

21. The signal processing method as set forth in claim 20, wherein the moving picture signal and the still picture signal are written to the same external storage medium.

22. The signal processing method as set forth in claim 19, wherein the still picture signal is converted into the moving picture signal corresponding to an operation input.

23. The signal processing method as set forth in claim 22, wherein the still picture signal of the plurality of discrete still pictures is combined in the order corresponding to the operation input.

24. The signal processing method as set forth in claim 22, wherein the still picture signal of selected still pictures is combined corresponding to the operation input.

25. The signal processing method as set forth in claim 19, wherein the still picture signal is converted into a GIF (Graphics Interchange Format) file format.

26. The signal processing method as set forth in claim 19, wherein the still picture signal is converted into a JPEG file format.

27. The signal processing method as set forth in claim 19, wherein the still picture signal of the plurality of discrete still pictures is combined in the time sequence.

28. The signal processing method as set forth in claim 19, further comprising the step of:
inputting means for inputting a still picture signal,
wherein the still picture signal is converted into a moving picture signal that allows a plurality of discrete still pictures to be correlatively displayed on the time base.

29. The signal processing method as set forth in claim 28, wherein a still picture signal is input from an external storage medium.

30. The signal processing method as set forth in claim 29, wherein the moving picture signal that is output is written to the external storage medium.

31. The signal processing method as set forth in claim 19, wherein a plurality of still pictures are combined and converted into a moving picture signal corresponding to the operation input.

32. The signal processing method as set forth in claim 19, wherein a moving picture signal is input from an external storage medium.

33. The signal processing method as set forth in claim 32, wherein an index signal of the still picture signal of the plurality of discrete still pictures is displayed.

34. The signal processing method as set forth in claim 19, wherein the stored still picture signal or a signal corresponding to the still picture signal is displayed.

35. A signal processing method for generating a picture signal with a photograph signal and outputting the picture signal, comprising the steps of:
photographing an object;
generating a picture signal with a signal of the photographed object;
storing the picture signal;
converting the picture signal into a moving picture signal that allows a plurality of discrete still pictures to be correlatively displayed on the time base; and
outputting the moving picture signal;
wherein the still picture signal of a plurality of discrete pictures stored is directly output without converting the still picture signal into the moving picture signal; and
wherein the still picture signal is converted into a JPEG file format.

* * * * *